United States Patent
Kobayashi et al.

(10) Patent No.: US 7,933,159 B2
(45) Date of Patent: Apr. 26, 2011

(54) SEMICONDUCTOR MEMORY DEVICE AND SYSTEM WITH REDUNDANT ELEMENT

(75) Inventors: Hiroyuki Kobayashi, Kawasaki (JP); Daisuke Kitayama, Kawasaki (JP)

(73) Assignee: Fujitsu Semiconductor Limited, Yokohama (JP)

(*) Notice: Subject to any disclaimer, the term of this patent is extended or adjusted under 35 U.S.C. 154(b) by 0 days.

(21) Appl. No.: 12/683,029

(22) Filed: Jan. 6, 2010

(65) Prior Publication Data

US 2010/0110809 A1    May 6, 2010

Related U.S. Application Data

(63) Continuation of application No. PCT/JP2007/063855, filed on Jul. 11, 2007.

(51) Int. Cl.
*G11C 29/00* (2006.01)

(52) U.S. Cl. ........................... 365/200; 365/201

(58) Field of Classification Search ............ 365/200
See application file for complete search history.

(56) References Cited

U.S. PATENT DOCUMENTS

| | | | | |
|---|---|---|---|---|
| 5,465,234 A * | 11/1995 | Hannai | ............. | 365/200 |
| 5,485,424 A * | 1/1996 | Kawamura | ............. | 365/200 |
| 5,517,455 A | 5/1996 | McClure et al. | | |
| 5,652,725 A * | 7/1997 | Suma et al. | ............. | 365/200 |
| 5,801,986 A | 9/1998 | Matsumoto et al. | | |
| 5,970,003 A * | 10/1999 | Miyatake et al. | ............. | 365/200 |
| 6,023,433 A * | 2/2000 | Koshikawa | ............. | 365/200 |
| 6,404,683 B1 * | 6/2002 | Yumoto | ............. | 365/200 |
| 2002/0031017 A1 * | 3/2002 | Yumoto | ............. | 365/200 |

FOREIGN PATENT DOCUMENTS

| | | |
|---|---|---|
| JP | 06-150689 A | 5/1994 |
| JP | 06-163704 A | 6/1994 |
| JP | 06-243698 A | 9/1994 |
| JP | 07-288078 A | 10/1995 |
| JP | 09-035493 A | 2/1997 |
| JP | 09-251797 A | 9/1997 |

* cited by examiner

*Primary Examiner* — Tuan T. Nguyen
(74) *Attorney, Agent, or Firm* — Arent Fox LLP

(57) ABSTRACT

A semiconductor memory device includes a memory cell array, a redundant element, an address specifying circuit configured to select one of a plurality of addresses as a redundancy address in response to a switchover signal, a decoder circuit configured to select the redundant element in response to an externally applied address that matches the redundancy address selected by the address specifying circuit, and a test mode setting circuit configured to change the switchover signal in response to an externally applied input, thereby to cause the redundancy address assigned to the redundant element to be switched between different ones of the plurality of addresses.

10 Claims, 13 Drawing Sheets

SEMICONDUCTOR MEMORY DEVICE AND SYSTEM WITH REDUNDANT ELEMENT

CROSS-REFERENCE TO RELATED APPLICATIONS

This is a continuation of International Application No. PCT/JP2007/063855, filed on Jul. 11, 2007, the entire contents of which are hereby incorporated by reference.

FIELD

The disclosures herein generally relate to semiconductor memory devices, and particularly relate to a semiconductor memory device having a redundancy function.

BACKGROUND

Semiconductor memory devices are provided with a redundancy function to replace a defective memory cell with a redundancy memory cell that is a backup memory cell. Memory cell operations are tested at the time of shipment of a semiconductor memory device. Upon finding a defective memory cell, the address of this defective memory cells is recorded in a fuse circuit or the like. An address to be accessed that is applied from an external device may match the address of the defective memory cell that is recorded in the fuse circuit. Upon such an event, an access location is switched to a redundant memory cell, thereby causing the redundant memory cell, rather than the defective memory cell, to be accessed. With this arrangement, the address of the defective memory cell is made usable. In general, a redundancy replacement operation is performed on a word-line-by-word-line basis or a column-line-by-column-line basis.

The use of a redundant memory cell is avoided if this redundant memory cell is defective. To this end, a test to check the operations of a semiconductor memory device preferably includes not only a test to check primary memory cell operations but also a test to check redundant memory cell operations. With the configuration that performs a redundancy replacement on a word-line-by-word-line basis, for example, all the primary word lines and all the redundant word lines are tested for operations. Every access is performed with respect to a primary word line if no recording has been made to the fuse circuit. In order to test redundant word line operations, a test mode that specifies a redundant line test is activated. Access to a desired redundant word line is then performed by specifying an address assigned to this redundant word line.

In tests to check operations, row address (i.e., word-line address) input patterns differ depending on the types of tests. In one operation test, it may be preferable to increment the row address successively to access word lines one by one in the order in which they are arranged. In another operation test (e.g., disturb test or the like), it may be preferable to access adjacent word lines alternately.

In the operation test in which the word lines are accessed one by one in the order of arrangement, a given redundant word line and a primary word line situated physically adjacent to this redundant word line may preferably be assigned to the same row address. With the assignment of the same row address, the operation to activate a test mode to select the redundant word line and then to exit from the test mode allows the adjacent primary word line to be selected without changing the address. In such a configuration in which a redundant word line and a primary word line physically adjacent to this redundant word line are assigned to the same row address, however, an entry into and exit from the test mode may be repeated to perform the operation test in which these adjacent word lines are accessed alternately. This gives rise to a problem in that the operation test becomes lengthy.

In order to perform an operation test in which adjacent word lines are alternately accessed at high speed, it may be preferable to assign a redundant word line and a primary word line physically adjacent to this redundant word line to two different row addresses. With such an assignment of two row addresses, these two row addresses may alternately be selected in a continuing test mode to access the adjacent word lines alternately. In such a case, however, an address assigned to the redundant word line is first applied to select the redundant word line, and, then, another address separate from the above-noted address is applied to select the adjacent primary word line for the purpose of performing an operation test in which word lines are accessed one by one in the order of arrangement. Applied addresses are not continuous in this case. This gives rise to a problem in that separate address registers may be provided, one for selecting redundant word lines and another for selecting primary word lines. Further, an applied address pattern may become complex.

The description of the above-noted problems has been given with reference to the case of word-line-specific redundancy. Similar problems also arise in the case of column-line-specific redundancy. A preferable address value to be assigned to a given redundancy element (e.g., a redundant word line) may differ for different address input patterns that are used in different operation tests.

Patent Document 1 discloses a semiconductor memory in which a pseudo fuse-cut state is created on a bit-by-bit basis. This semiconductor memory includes a plurality of redundancy unit address memories, and is provided with a redundancy address memory to store a defective address assigned to a redundant word line or a redundant bit line. Patent Document 2 discloses a semiconductor memory provided with a program circuit that selects a redundancy address based on an external signal and address signals without cutting fuses. This program circuit selects redundant memory cells by use of different combinations of address signals.

[Patent Document 1] Japanese Laid-open Patent Publication No. 11-163704

[Patent Document 2] Japanese Laid-open Patent Publication No. 06-243698

SUMMARY

According to an aspect of the embodiment, a semiconductor memory device includes a memory cell array, a redundant element, an address specifying circuit configured to select one of a plurality of addresses as a redundancy address in response to a switchover signal, a decoder circuit configured to select the redundant element in response to an externally applied address that matches the redundancy address selected by the address specifying circuit, and a test mode setting circuit configured to change the switchover signal in response to an externally applied input, thereby to cause the redundancy address assigned to the redundant element to be switched between different ones of the plurality of addresses.

The object and advantages of the embodiment will be realized and attained by means of the elements and combinations particularly pointed out in the claims. It is to be understood that both the foregoing general description and the following detailed description are exemplary and explanatory and are not restrictive of the invention, as claimed.

DESCRIPTION OF EMBODIMENTS

In the following, embodiments will be described with reference to the accompanying drawings.

Figure 1:
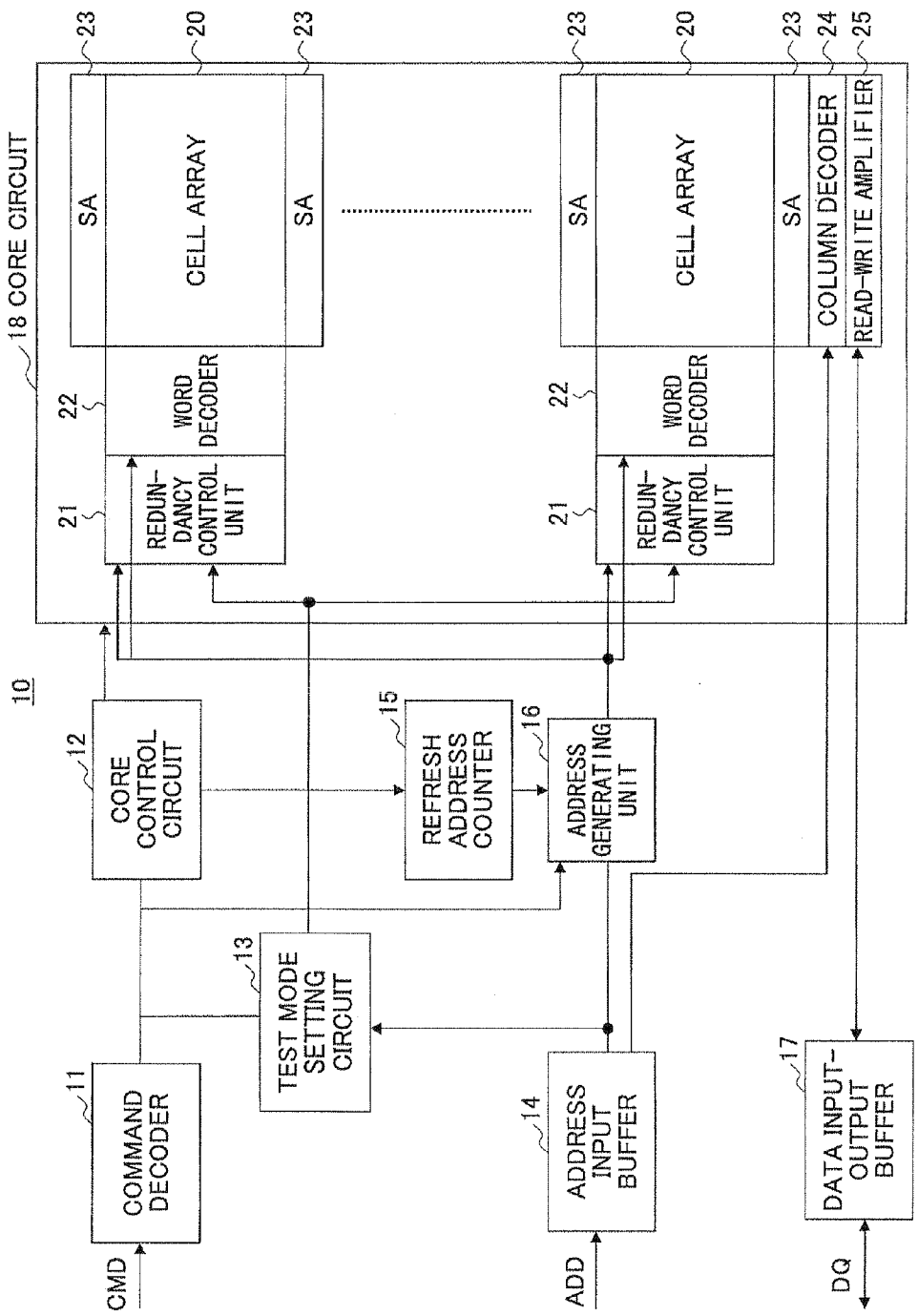
FIG. 1 is a drawing illustrating an example of the configuration of a semiconductor memory device.

FIG. 1 is a drawing illustrating an example of the configuration of a semiconductor memory device. A semiconductor memory device 10 of FIG. 1 includes a command decoder 11, a core control circuit 12, a test mode setting circuit 13, an address input buffer 14, a refresh address counter 15, an address generating unit 16, a data input-output buffer 17, and a core circuit 18. The core circuit 18 includes a plurality of cell arrays 20. In the core circuit 18, further, a redundancy control unit 21, a word decoder 22, and a sense amplifier (SA) 23 are provided for each cell array 20. Further, the column decoder 24 and read-write amplifier 25 are provided to be shared by the plurality of cell arrays 20.

The command decoder 11 receives control signals indicating commands from an external device outside the semiconductor memory device 10. The command decoder 11 decodes these control signals to generate various control signals based on the decoded results. These control signals are supplied to relevant circuit parts such as the core control circuit 12, the test mode setting circuit 13, the address generating unit 16, and so on. For example, the command decoder 11 supplies to the test mode setting circuit 13 a signal requesting the loading of operation test settings into a register in response to a mode register setting command.

The core control circuit 12 generates various timing signals corresponding to operations (e.g., data read operation, data write operation, and the like) specified by the control signals based on a clock signal and the control signals from the command decoder 11. The generated timing signals are supplied to the core circuit 18 and the refresh address counter 15, for example. Each circuit part operates in accordance with the timings specified by these timing signals.

The test mode setting circuit 13 loads part of address signals supplied from the address input buffer 14 as register settings in response to an instruction that is supplied from the command decoder 11 responding to a mode register setting command. Namely, part of address signals is stored in an internal mode register as setting values indicative of the specifications of an operation test. Settings regarding the operation test may be changed to modify the specifications of the operation test or to change a switchover signal SW that will be described later.

The address input buffer 14 receives address signals indicative of a row address and address signals indicative of a column address from an external source outside the chip of the semiconductor memory device 10. The received row address is supplied to the address generating unit 16, and the received column address is supplied to the column decoder 24. Further, the address signals are supplied to the test mode setting circuit 13.

The refresh address counter 15 operates under the control of the core control circuit 12 to generate a refresh address that is a target address for which a refresh operation is to be performed. The generated refresh address is supplied to the address generating unit 16. Based on the row address from the address input buffer 14 and the refresh address from the refresh address counter 15, the address generating unit 16 supplies a row address indicative of a word line to be accessed in a read operation, a write operation, and a refresh operation.

In each cell array 20 of the core circuit 18, a plurality of memory cells are arranged in a matrix form extending in a row direction and a column direction to constitute a cell array. Each memory cell stores data. Each cell array 20 includes a plurality of word lines corresponding to a plurality of row addresses, and a plurality of memory cells are coupled to each word line. A plurality of bits lines are arranged in a direction in which column addresses are arranged, and sense amplifiers are coupled to the respective bit lines.

In the cell array 20 that is specified as the one to be activated by part of the row address (i.e., block address), the word decoder 22 decodes the row address supplied from the address generating unit 16 to selectively activate a word line specified by the row address. The column decoder 24 decodes the column address supplied from the address input buffer 14, and selectively activates a column selecting line specified by the column address.

Data stored in memory cells connected to the activated word line are read to the bit lines and amplified by the sense amplifier 23. In the case of a read operation, the data amplified by the sense amplifier 23 is subjected to selection by the activated column selecting line, and the selected data is output to outside the semiconductor memory device 10 via the read-write amplifier 25 and the data input-output buffer 17. In the case of a write operation, write data is supplied from an external source outside the semiconductor memory device 10 via the data input-output buffer 17 and the read-write amplifier 25, and is written to the sense amplifier 23 at the column address selected by the activated column selecting line in the cell array 20 that is activated. This write data and the data that were read from memory cells and ought to be restored are written to the memory cells connected to the activated word line.

The example of the semiconductor memory device 10 illustrated in FIG. 1 is directed to a configuration in which redundancy control is performed on a word-line-by-word-line basis. Such redundancy control is performed by the redundancy control unit 21. It should be noted that the unit of redundancy control may be a word address for replacement of a word line, a column address for replacement of a column line, or a given address unit that achieves the replacement of another redundancy element.

Figure 2:
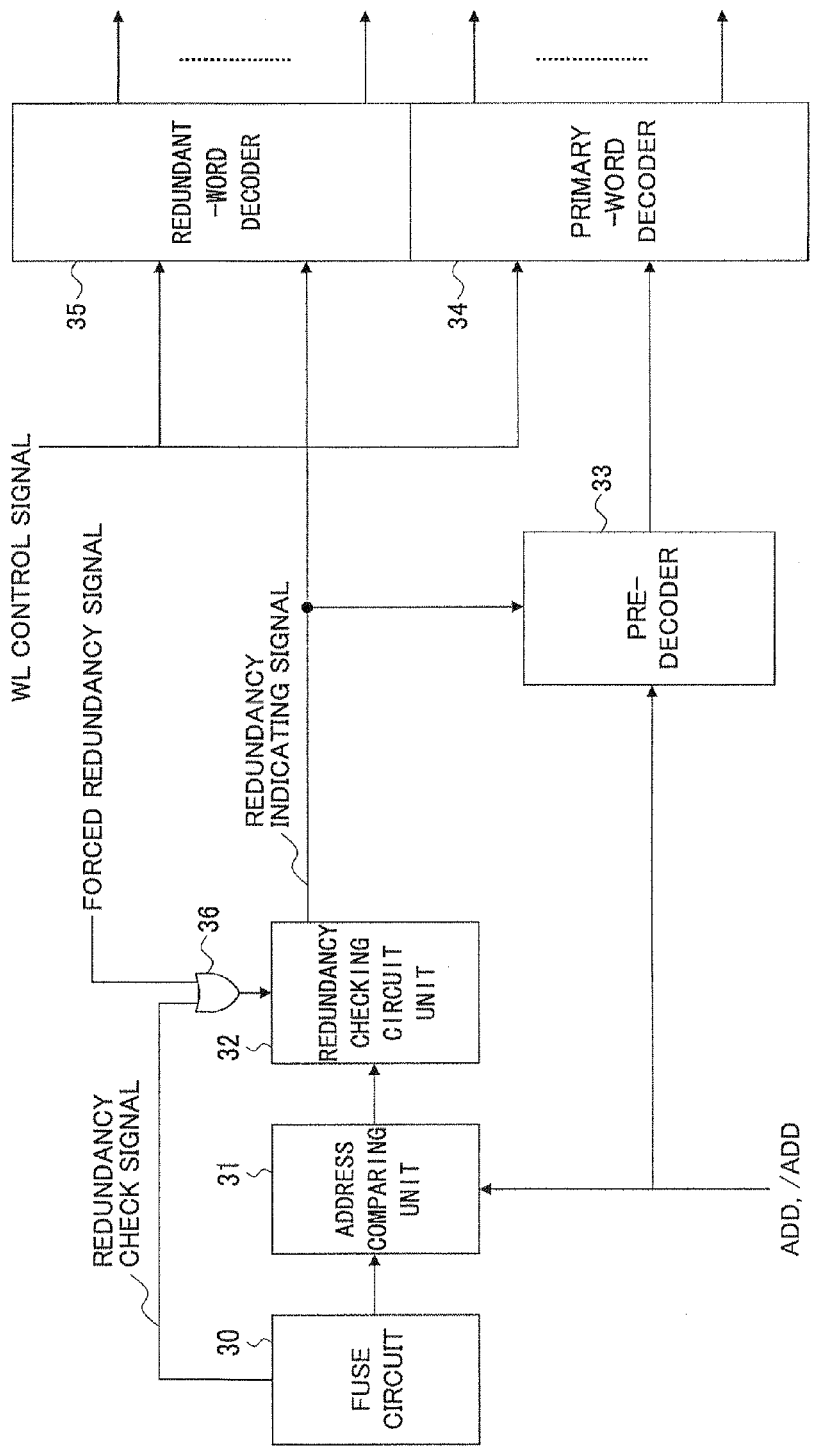
FIG. 2 is a drawing for explaining a configuration for redundancy control in the semiconductor memory device.

FIG. 2 is a drawing for explaining a configuration for redundancy control in the semiconductor memory device 10. The configuration illustrated in FIG. 2 includes a fuse circuit 30, an address comparing unit 31, a redundancy checking circuit unit 32, a pre-decoder 33, a primary-word decoder 34, and a redundant-word decoder 35. The fuse circuit 30, the address comparing unit 31, and the redundancy checking circuit unit 32 correspond to the redundancy control unit 21 illustrated in FIG. 1, and the pre-decoder 33, the primary-word decoder 34, and the redundant-word decoder 35 correspond to the word decoder 22 illustrated in FIG. 1.

The fuse circuit 30 includes a plurality of fuses. Fuses are selectively cut through exposure to laser light or the like to specify addresses for which redundancy replacement is performed. Namely, a defective memory cell may be found at a row address X as a result of an operation test of the semiconductor memory device 10. Upon such an event, fuses are selectively cut in the fuse circuit 30, such that the output signals of the fuse circuit 30 responsive to the cut or intact states of the fuses indicate the row address X as a redundancy address.

The fuse circuit 30 is also configured to output a redundancy check signal to indicate whether a redundancy address has already been set such that the output signals of the fuse circuit 30 specify a valid redundancy address. The state of the redundancy check signal is checked to determine whether the output signals of the fuse circuit 30 are to be used as a redundancy address.

The address comparing unit 31 compares a redundancy address indicated by the output signals of the fuse circuit 30 with an access address indicated by address signals ADD applied to the semiconductor memory device 10 from an external source. For the sake of convenience of processing, the address signals ADD and the inverted signals /ADD are supplied to the address comparing unit 31. The address comparing unit 31 outputs a signal indicative of bitwise match or mismatch between the redundancy address and the access address.

The redundancy checking circuit unit 32 asserts a redundancy indicating signal in response to an event that the signal indicative of bitwise match or mismatch indicates matches for all the bits when the redundancy check signal is HIGH. The assertion of the redundancy indicating signal causes the outputs of the pre-decoder 33 for pre-decoding the externally-applied address signals ADD to be blocked. Since no pre-decode signal is output from the pre-decoder 33, the primary-word decoder 34 does not select a primary word line.

In response to the assertion of the redundancy indicating signal, further, the redundant-word decoder 35 selectively activates a redundant word line corresponding to the fuse circuit 30. Although not illustrated, plural sets each comprised of the fuse circuit 30, the address comparing unit 31, and the redundancy checking circuit unit 32 may be provided in one-to-one correspondence to the plural redundant word lines. When an access address specified by an external source matches a redundancy address indicated by a given fuse circuit 30, the redundant word line corresponding to this fuse circuit 30 will be selected.

At the time the semiconductor memory device 10 is about to be tested for operations, defective addresses are yet unknown. No redundancy address is set in the fuse circuit 30. In this state, the output signals of the fuse circuit 30 are invalid, and the redundancy check signal is set to LOW indicating the invalid state. In the operation test of the semiconductor memory device 10, however, it may be desirable to test the redundant memory cells by allowing the redundant-word decoder 35 to select the redundant word lines. In the operation test mode of the semiconductor memory device 10, the test mode setting circuit 13 (see FIG. 1) is configured such that the forced redundancy signal output from the test mode setting circuit 13 is set to HIGH according to need. When the forced redundancy signal is set to HIGH, the output of an OR gate 36 for performing a logical sum between the forced redundancy signal and the redundancy check signal becomes HIGH. The redundancy checking circuit unit 32 thus operates similarly to the manner in which it operates in the case of the redundancy check signal being HIGH. Namely, the redundancy checking circuit unit 32 asserts a redundancy indicating signal in response to an event that the signal indicative of bitwise match or mismatch supplied from the address comparing unit 31 indicates matches for all the bits. The configuration illustrated in FIG. 2 is only an example. The configuration that combines the redundancy check signal and the forced redundancy signal to activate a redundancy operation may be embedded in the address comparing unit 31, for example.

Further, the semiconductor memory device 10 of the present embodiment uses to test mode setting circuit 13 to produce a switchover signal, and changes this switchover signal in response to an input from an external source. This arrangement allows a redundancy address assigned to a redundant element (i.e., word line in this example) in the redundancy control unit 21 to be modified. In the following, such a configuration will be described.

Figure 3:
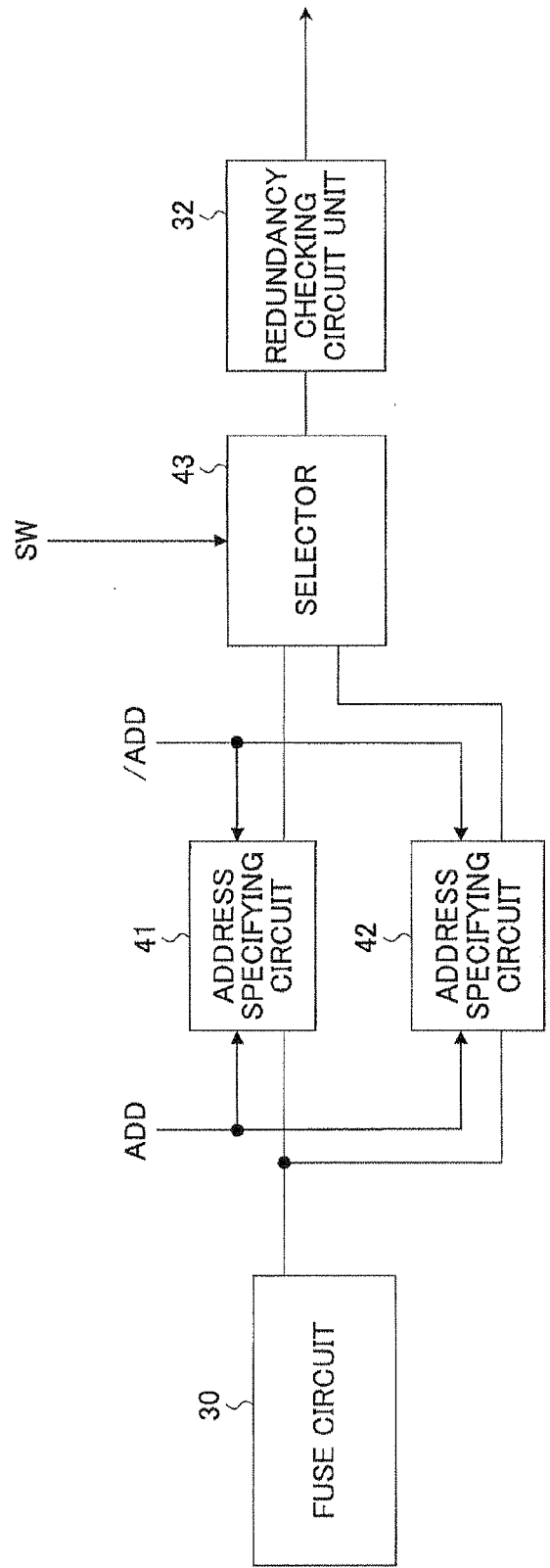
FIG. 3 is a drawing illustrating a first embodiment of an address comparing unit illustrated in FIG. 2.

FIG. 3 is a drawing illustrating a first embodiment of the address comparing unit illustrated in FIG. 2. In FIG. 3, the same elements as those of FIG. 2 are referred to by the same numerals, and a description thereof will be omitted. FIG. 3 illustrates the fuse circuit 30, the redundancy checking circuit unit 32, an address specifying circuit 41, an address specifying circuit 42, and a selector 43. The address specifying circuit 41, the address specifying circuit 42, and the selector 43 correspond to the address comparing unit 31 illustrated in FIG. 2.

The address specifying circuit 41 and the address specifying circuit 42 serve to specify a first address and a second address, respectively, based on their internal wire connections. The address specifying circuit 41 produces a first bit pattern indicative of bitwise matches or mismatches between the first address and an externally applied address. The address specifying circuit 42 produces a second bit pattern indicative of bitwise matches or mismatches between the first address and an externally applied address.

The selector 43 selects either one of the output of the address specifying circuit 41 and the output of the address specifying circuit 42 in response to the switchover signal SW supplied from the test mode setting circuit 13. The selected signal is supplied to the redundancy checking circuit unit 32. In the case of the address specifying circuit 41 being selected, the first bit pattern indicative of bitwise matches or mismatches between the first address and an externally applied address is supplied to the redundancy checking circuit unit 32. In the case of the address specifying circuit 42 being selected, the second bit pattern indicative of bitwise matches or mismatches between the second address and an externally applied address is supplied to the redundancy checking circuit unit 32. The redundancy checking circuit unit 32 asserts its output, i.e., a redundancy indicating signal, upon detecting matches for all the bits of the supplied bit pattern.

In this manner, the present embodiment is configured such that the address specifying circuits 41 and 42 and the selector 43 are provided to select one of the plurality of addresses as a redundancy address in response to the switchover signal SW. The number of addresses from which a selection is made is not limited to two as used in the above-described example, but may be three or more. With such a configuration, the test mode setting circuit 13 may change the switchover signal SW in response to an externally applied input, thereby changing a redundancy address assigned to a redundant element (e.g., a predetermined redundant word line). Namely, the redundancy address assigned to a redundant word line corresponding to the fuse circuit 30 may be switched between different addresses as appropriate. This allows an optimum redundancy address to be assigned in response to the specifications of an operation test.

In FIG. 3, the selector 43 is directly connected to the output nodes of the address specifying circuits 41 and 42 to select either one of the output of the address specifying circuit 41 and the output of the address specifying circuit 42. The present embodiment is not limited to such a configuration. For example, two redundancy checking circuit units 32 may be provided to receive the outputs of the address specifying circuits 41 and 42, respectively, and the selector 43 may select one of the outputs of the two redundancy checking circuit units 32. Namely, the output of the address specifying circuit 41 and the output of the address specifying circuit 42 may be selected at a stage situated after the redundancy checking circuit units, rather than at a stage immediately following the output nodes of the address specifying circuits.

Figure 4:
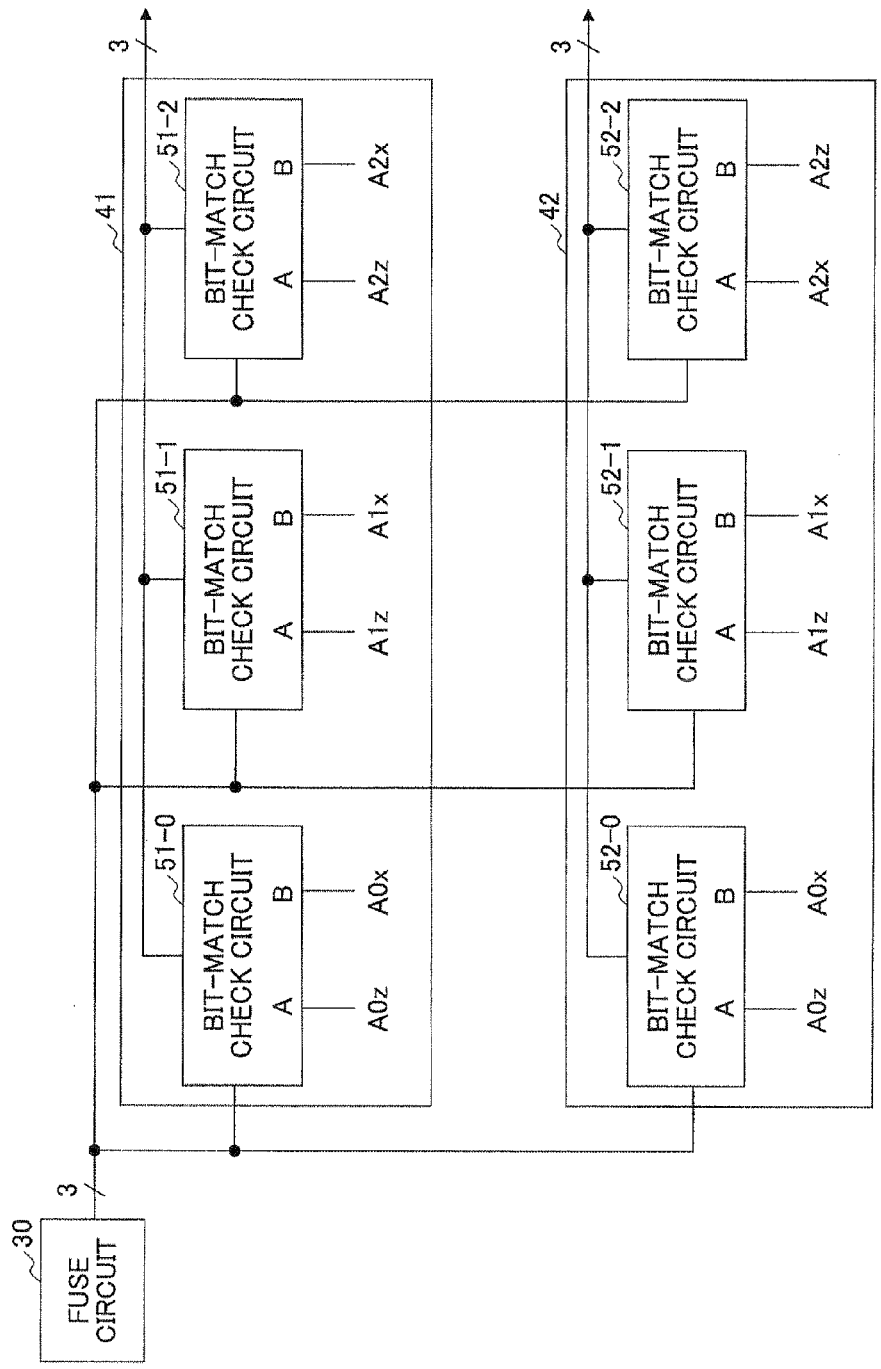
FIG. 4 is a drawing illustrating an example of the configuration of address specifying circuits.

FIG. 4 is a drawing illustrating an example of the configuration of the address specifying circuits 41 and 42. In FIG. 4, bit-match check circuits 51-0 through 51-2 correspond to the address specifying circuit 41, and bit-match check circuits 52-0 through 52-2 correspond to the address specifying circuit 42. The example illustrated in FIG. 4 demonstrates a case in which the address to be checked for redundancy operations is comprised of three bits, for the sake of convenience of explanation.

The output of the fuse circuit 30 is comprised of three bits corresponding to a redundancy address. The least significant bit (i.e., first bit) is supplied to the bit-match check circuit 51-0. The second bit is supplied to the bit-match check circuit 51-1. The most significant bit (i.e., third bit) is supplied to the bit-match check circuit 51-2. Similarly, the least significant bit (i.e., first bit) is supplied to the bit-match check circuit 52-0. The second bit is supplied to the bit-match check circuit 52-1. The most significant bit (i.e., third bit) is supplied to the bit-match check circuit 52-2.

Figure 5:
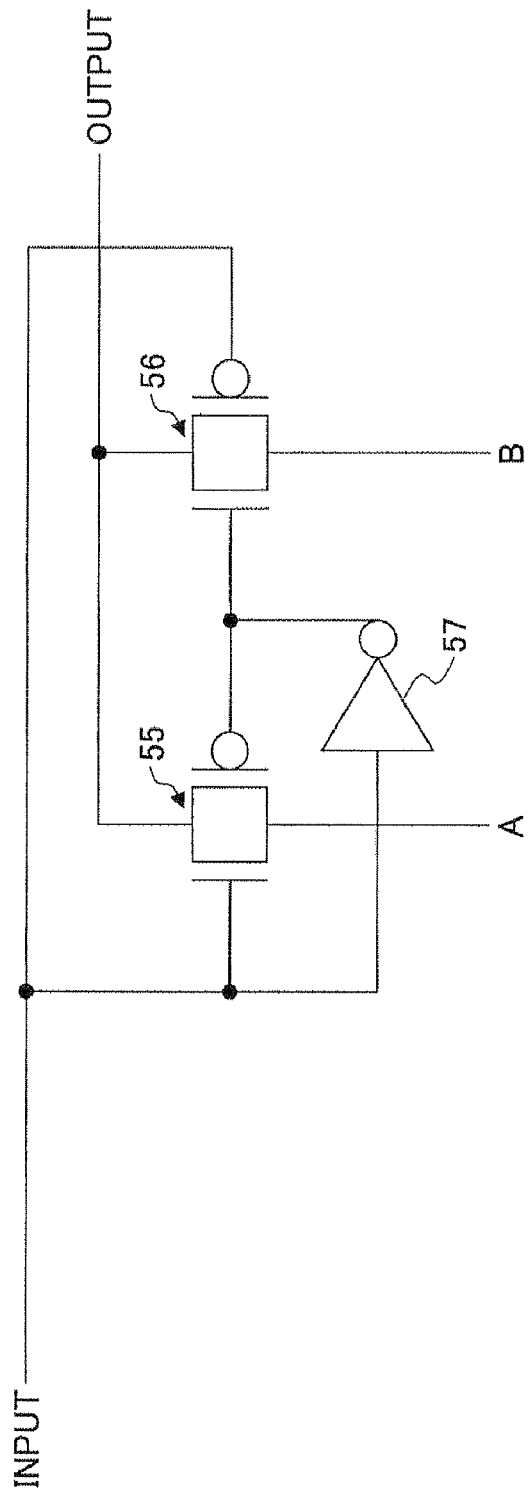
FIG. 5 is a drawing illustrating an example of the configuration of a bit-match check circuit.

FIG. 5 is a drawing illustrating an example of the configuration of a bit-match check circuit. Each bit-match check circuit illustrated in FIG. 4 has the configuration illustrated in FIG. 5.

The bit-match check circuit illustrated in FIG. 5 includes a transfer gate 55 comprised of a PMOS transistor and an NMOS transistor connected in parallel, a transfer gate 56 comprised of a PMOS transistor and an NMOS transistor connected in parallel, and an inverter 57. A signal applied to the A input is selected as an output signal when the input from the fuse circuit 30 is HIGH. A signal applied to the B input is selected as an output signal when the input from the fuse circuit 30 is LOW. The A input and B input correspond to a given bit of an applied address signal and a bit inversion thereof, respectively.

In the case of the bit-match check circuit 51-2 illustrated in FIG. 4, the A input is A2z, and the B input is A2x. The symbol "A2" appearing in the signal name indicates the most significant bit of the applied row address. The symbol "x" appearing at the end of the signal name indicates the positive logic, and the symbol "z" appearing at the end of the signal name indicates the negative logic. In this manner, the positive logic value of a corresponding bit of the address signals is applied to the A input, and the negative logic value of this corresponding bit is applied to the B input.

The output is "1" if the input signal from the fuse circuit 30 is "0", and concurrently if the corresponding bit (positive logic) of the input address is "0". The output is "0" if the input signal from the fuse circuit 30 is "0", and concurrently if the corresponding bit (positive logic) of the input address is "1". The output is "0" if the input signal from the fuse circuit 30 is "1", and concurrently if the corresponding bit (positive logic) of the input address is "0". The output is "1" if the input signal from the fuse circuit 30 is "1", and concurrently if the corresponding bit (positive logic) of the input address is "1". In this manner, the output of the bit-match check circuit is a signal indicative of a match or mismatch between a bit value supplied from the fuse circuit 30 and an applied address signal bit value.

With the bit-match check circuits 51-0 through 51-2 (or 52-0 through 52-2) illustrated in FIG. 4, the positions of positive logic values and negative logic values of the address signals are used to specify an address value. In the case of the bit-match check circuits 51-0 through 51-2, for example, all the A inputs receive positive logic values, and all the B inputs receive negative logic values. The output bits of the fuse circuit 30 may be set to LOW as a default. In such a case, all the output bits of the bit-match check circuits 51-0 through 51-2 are "1" only when the applied address A2z through A0z is "000". Based on the understanding that the output "1" indicates a match, the address specifying circuit 41 including the bit-match check circuits 51-0 through 51-2 is regarded as specifying the address "000". The output bits of the fuse circuit 30 may be set to HIGH as a default. In such a case, all the output bits of the bit-match check circuits 51-0 through 51-2 are "0" only when the applied address A2z through A0z is "000". Based on the understanding that the output "0" indicates a match in this case, the address specifying circuit 41 including the bit-match check circuits 51-0 through 51-2 is regarded as specifying the address "000".

In the case of the bit-match check circuits 52-0 through 52-2, the A inputs are positive logic values and the B inputs are negative logic values for the bit-match check circuits 52-0 and 52-1. For the bit-match check circuit 51-2, however, the A input is a negative logic value, and the B input is a positive logic value. The output bits of the fuse circuit 30 may be set to LOW as a default. In such a case, all the output bits of the bit-match check circuits 52-0 through 52-2 are "1" only when the applied address A2z through A0z is "100". Based on the understanding that the output "1" indicates a match, the address specifying circuit 42 including the bit-match check circuits 52-0 through 52-2 is regarded as specifying the address "100".

At the time of testing the operations of the semiconductor memory device 10, the fuse circuit 30 is in the initial state in which no address setting has been made. The output bits of the fuse circuit 30 may thus be all set to LOW (or all set to HIGH). Accordingly, the positions of positive logic values and negative logic values of the address signals applied to the bit-match check circuits serve to specify a desired address.

In the example illustrated in FIG. 4, the address specifying circuit 41 specifies the address value "000", and the address specifying circuit 42 specifies the address value "100". When the address specifying circuit 41 is selected in FIG. 3, thus, the first bit pattern indicative of bitwise matches or mismatches between the address value "000" and an externally applied address is supplied to the redundancy checking circuit unit 32. When the address specifying circuit 42 is selected, the second bit pattern indicative of bitwise matches or mismatches between the address value "100" and an externally applied address is supplied to the redundancy checking circuit unit 32. In this manner, switching by use of the switchover signal SW allows either the redundancy address "000" or the redundancy address "100" to be selected and assigned to a corresponding redundant word line.

Figure 6:
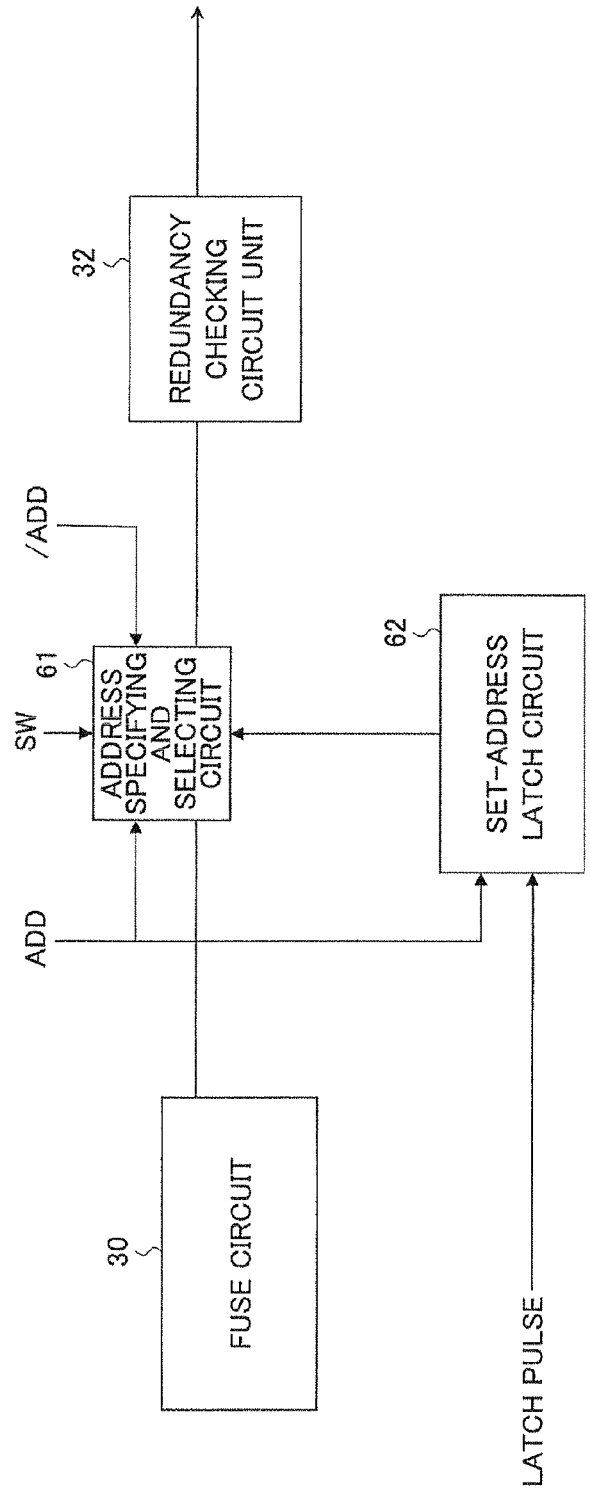
FIG. 6 is a drawing illustrating a second embodiment of the address comparing unit illustrated in FIG. 2.

FIG. 6 is a drawing illustrating a second embodiment of the address comparing unit illustrated in FIG. 2. In FIG. 6, the same elements as those of FIG. 2 are referred to by the same numerals, and a description thereof will be omitted. FIG. 6 illustrates the fuse circuit 30, the redundancy checking circuit unit 32, an address specifying and selecting circuit 61, and a set-address latch circuit 62. The address specifying and selecting circuit 61 and the set-address latch circuit 62 correspond to the address comparing unit 31 illustrated in FIG. 2.

The address specifying and selecting circuit 61 specifies an address by its internal wire connections. The set-address latch circuit 62 stores an externally applied address bit pattern in response to a latch pulse signal supplied from the core control circuit 12, for example. The address specifying and selecting circuit 61 is configured to selectively output, in response to the switchover signal SW, either the address specified by the address specifying and selecting circuit 61 itself or a second address responsive to the address bit pattern stored in the set-address latch circuit 62.

In this manner, the present embodiment is configured such that the address specifying and selecting circuit 61 and the set-address latch circuit 62 are provided to select one of the plurality of addresses as a redundancy address in response to the switchover signal SW. With such a configuration, the test mode setting circuit 13 may change the switchover signal SW in response to an externally applied input, thereby changing a redundancy address assigned to a redundant element (e.g., a predetermined redundant word line). Namely, the redundancy address assigned to a redundant word line corresponding to the fuse circuit 30 may be switched between different addresses as appropriate. This allows an optimum redundancy address to be assigned in response to the specifications of an operation test.

Figure 7:
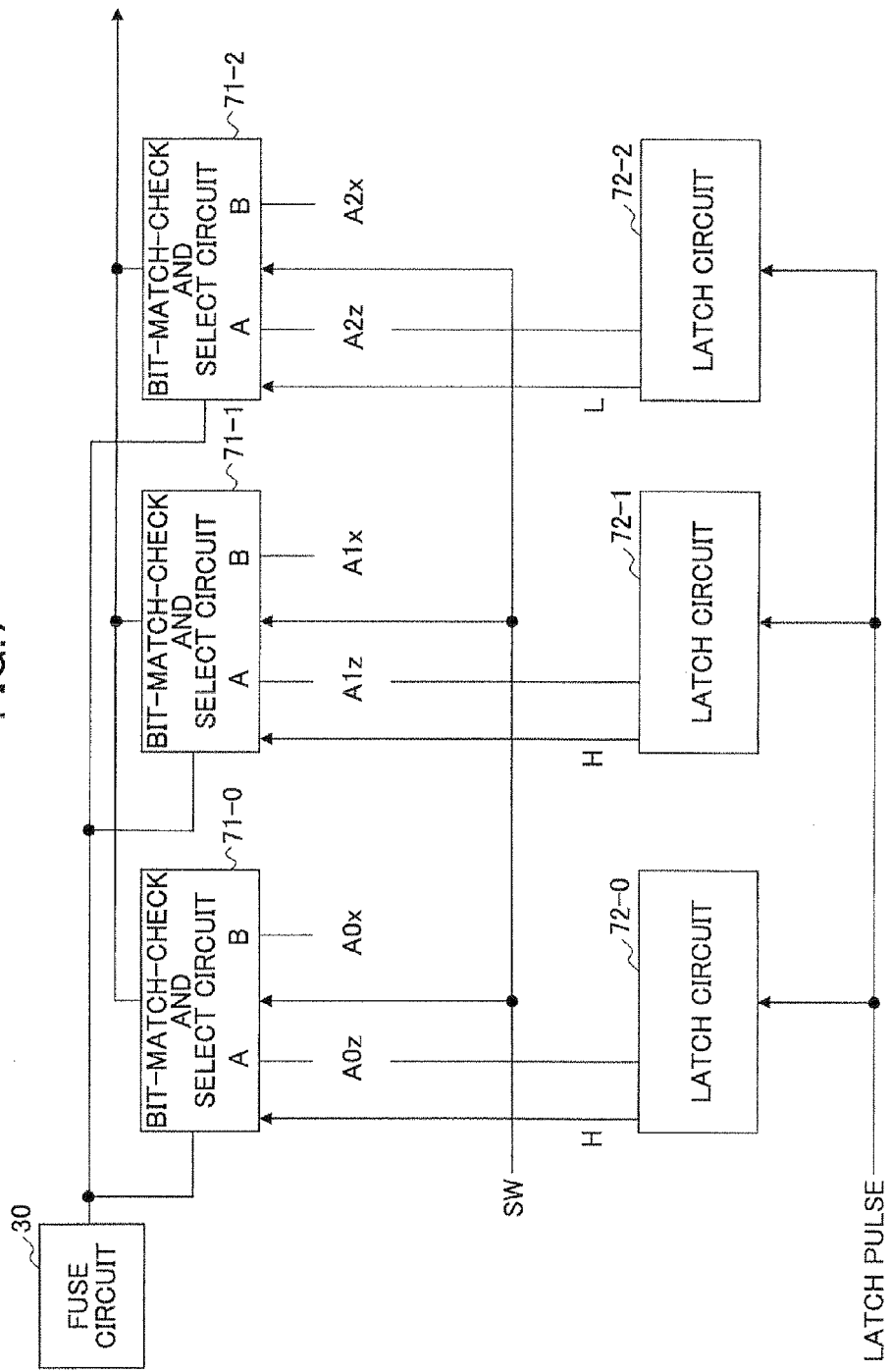
FIG. 7 is a drawing illustrating an example of the configuration of an address specifying and selecting circuit and a set-address latch circuit according to the second embodiment.

FIG. 7 is a drawing illustrating an example of the configuration of the address specifying and selecting circuit 61 and the set-address latch circuit 62. In FIG. 7, bit-match-check and select circuits 71-0 through 71-2 correspond to the address specifying and selecting circuit 61, and latch circuits 72-0 through 72-2 correspond to the set-address latch circuit 62. The example illustrated in FIG. 7 demonstrates a case in which the address to be checked for redundancy operations is comprised of three bits, for the sake of convenience of explanation.

The output of the fuse circuit 30 is comprised of three bits corresponding to a redundancy address. The least significant bit (i.e., first bit) is supplied to the bit-match-check and select circuit 71-0. The second bit is supplied to the bit-match-check and select circuit 71-1. The most significant bit (i.e., third bit) is supplied to the bit-match-check and select circuit 71-2. The latch circuits 72-0 through 72-2 load the corresponding bits A0z through A2z, respectively, of externally applied address signals in response to the latch pulse signal.

Figure 8:
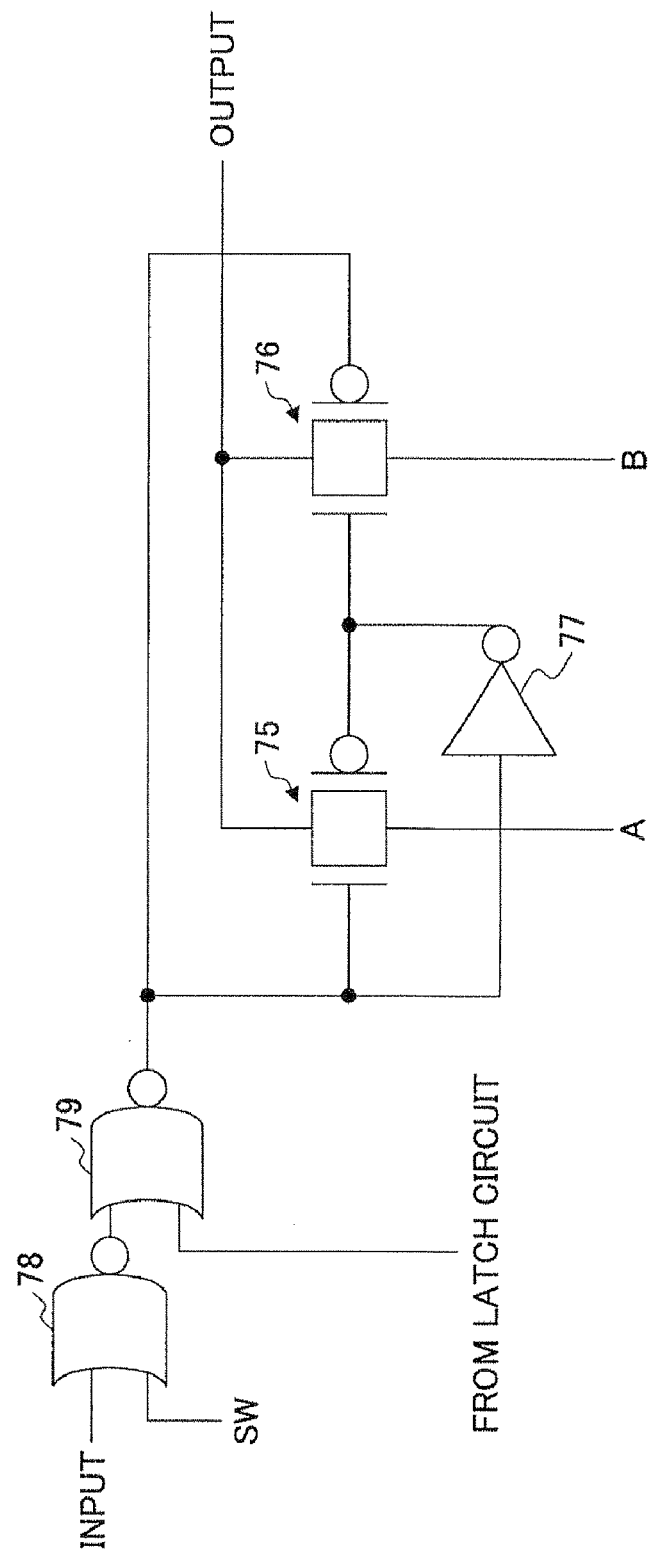
FIG. 8 is a drawing illustrating an example of the configuration of a bit-match-check and select circuit according to the second embodiment.

FIG. 8 is a drawing illustrating an example of the configuration of a bit-match-check and select circuit. Each bit-match-check and select circuit illustrated in FIG. 7 has the configuration illustrated in FIG. 8.

The bit-match-check and select circuit illustrated in FIG. 8 includes a transfer gate 75 comprised of a PMOS transistor and an NMOS transistor connected in parallel, a transfer gate 76 comprised of a PMOS transistor and an NMOS transistor connected in parallel, an inverter 77, a NOR gate 78, and a NOR gate 79. The operation of the circuit portion comprised of the transfer gate 75, the transfer gate 76, and the inverter 77 is similar to the operation of the circuit portion comprised of the transfer gate 55, the transfer gate 56, and the inverter 57 illustrated in FIG. 5, and a description thereof will be omitted.

One of the two inputs of the NOR gate 78 receives a corresponding bit of the output of the fuse circuit 30, which is set to LOW as a default when no redundancy address has been set. The other input of the NOR gate 78 receives a switchover signal SW analogous to the switchover signal used in the first embodiment. The output of the NOR gate 78 is HIGH when the switchover signal SW is LOW. In response, the output of the NOR gate 79 is set to LOW regardless of the output of the corresponding latch circuit, so that the B input is selected.

In this example, all the A inputs are positive logic values and all the B inputs are negative logic values for the bit-match-check and select circuits 71-0 through 71-2 illustrated in FIG. 7. It follows that all the output bits of the bit-match check circuits 71-0 through 71-2 are "1" only when the applied address A2z through A0z is "000". Based on the understanding that the output "1" indicates a match, the address specifying and selecting circuit 61 including the bit-match-check and select circuits 71-0 through 71-2 is regarded as specifying the address "000".

Referring to FIG. 8 again, the output of the NOR gate 78 is LOW when the switchover signal SW is HIGH. In this case, the output of the NOR gate 79 varies depending on the output of the corresponding latch circuit. The output of the NOR gate 79 is set to LOW in response to a HIGH output of the corresponding latch circuit, so that the B input is selected. The output of the NOR gate 79 is set to HIGH in response to a LOW output of the corresponding latch circuit, so that the A input is selected.

In this example, the signals supplied from the corresponding latch circuits to the bit-match-check and select circuits 71-0 through 71-2 illustrated in FIG. 7 are HIGH, HIGH, and LOW, respectively. It follows that all the output bits of the bit-match check circuits 71-0 through 71-2 are "1" only when the applied address A2z through A0z is "100". Based on the understanding that the output "1" indicates a match, the address specifying and selecting circuit 61 including the bit-match-check and select circuits 71-0 through 71-2 is regarded as specifying the address "100".

In this manner, the address specifying and selecting circuit 61 of the second embodiment produces a bit pattern indicative of bitwise matches or mismatches between the first address "000" and an externally applied address if the selecting circuit (i.e., NOR gate 78) selects the first address "000". This bit pattern is "111" if the applied address is "000". Further, the address specifying and selecting circuit 61 produces a bit pattern obtained by inverting or non-inverting the respective bits of the above-noted bit pattern indicative of bitwise matches or mismatches in response to the respective bit values of the address bit pattern "LHH" (i.e., the output of the set-address latch circuit 62) if the selecting circuit (i.e., NOR gate 78) selects the second address. The bit pattern indicative of bitwise matches or mismatches is "011" if the applied address is "100". The third bit of this bit pattern is inverted in response to the address bit pattern "LHH" to become "111". In this case, therefore, the redundancy address "100" is specified.

Figure 9:
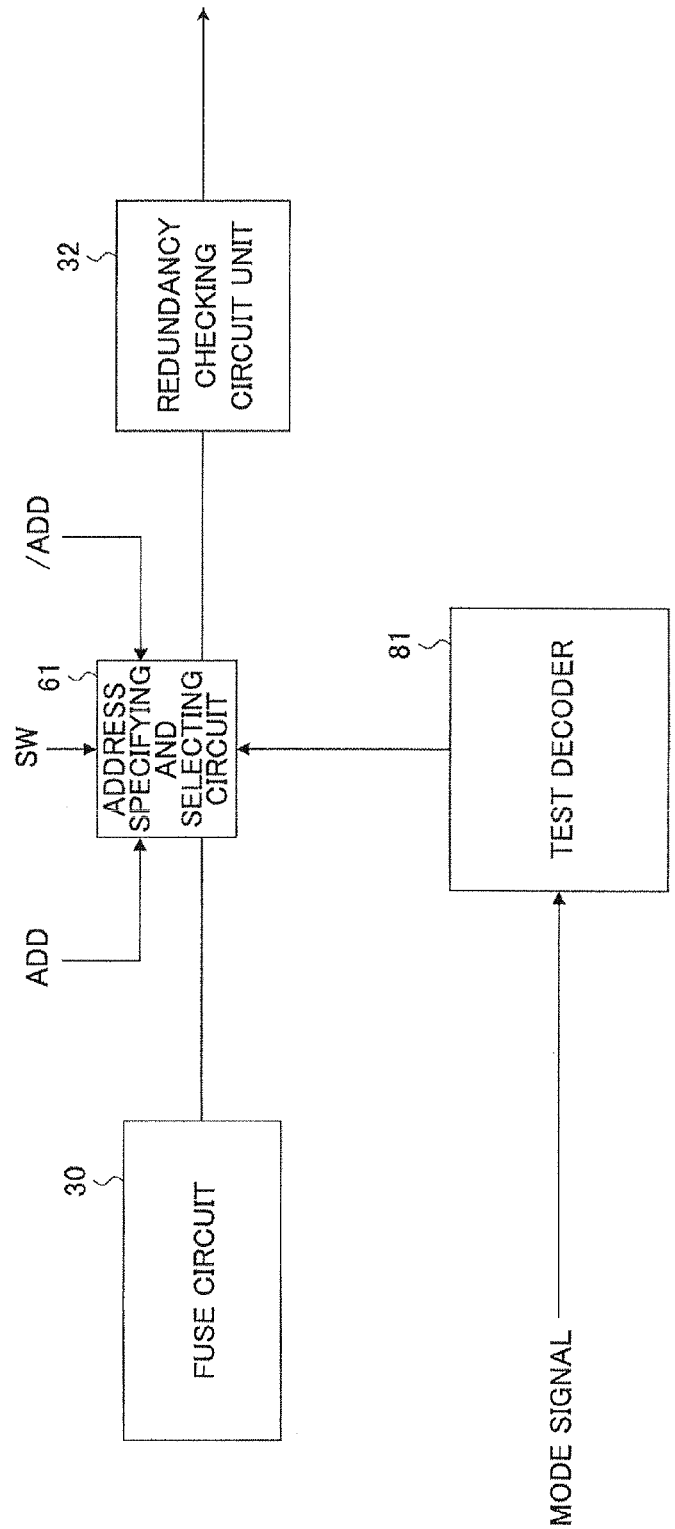
FIG. 9 is a drawing illustrating a third embodiment of the address comparing unit illustrated in FIG. 2.

FIG. 9 is a drawing illustrating a third embodiment of the address comparing unit illustrated in FIG. 2. In FIG. 9, the same elements as those of FIG. 2 and FIG. 6 are referred to by the same numerals, and a description thereof will be omitted. FIG. 9 illustrates the fuse circuit 30, the redundancy checking circuit unit 32, the address specifying and selecting circuit 61, and a test decoder 81. The address specifying and selecting circuit 61 and the test decoder 81 correspond to the address comparing unit 31 illustrated in FIG. 2.

The address specifying and selecting circuit 61 specifies an address by its internal wire connections. The test decoder 81 decodes mode signals supplied from the test mode setting circuit 13 to produce an address bit pattern responsive to externally applied signals. The address specifying and selecting circuit 61 selects, in response to the switchover signal SW, either the specified address specified by the address specifying and selecting circuit 61 or an address obtained by modifying the specified address in response to the address bit pattern supplied from the test decoder 81.

In this manner, the present embodiment is configured such that the address specifying and selecting circuit 61 and the test decoder 81 are provided to select one of the plurality of addresses as a redundancy address in response to the switchover signal SW. With such a configuration, the test mode setting circuit 13 may change the switchover signal SW in response to an externally applied input, thereby changing a redundancy address assigned to a redundant element (e.g., a predetermined redundant word line). Namely, the redundancy address assigned to a redundant word line corresponding to the fuse circuit 30 may be switched between different addresses as appropriate. This allows an optimum redundancy address to be assigned in response to the specifications of an operation test.

Figure 10:
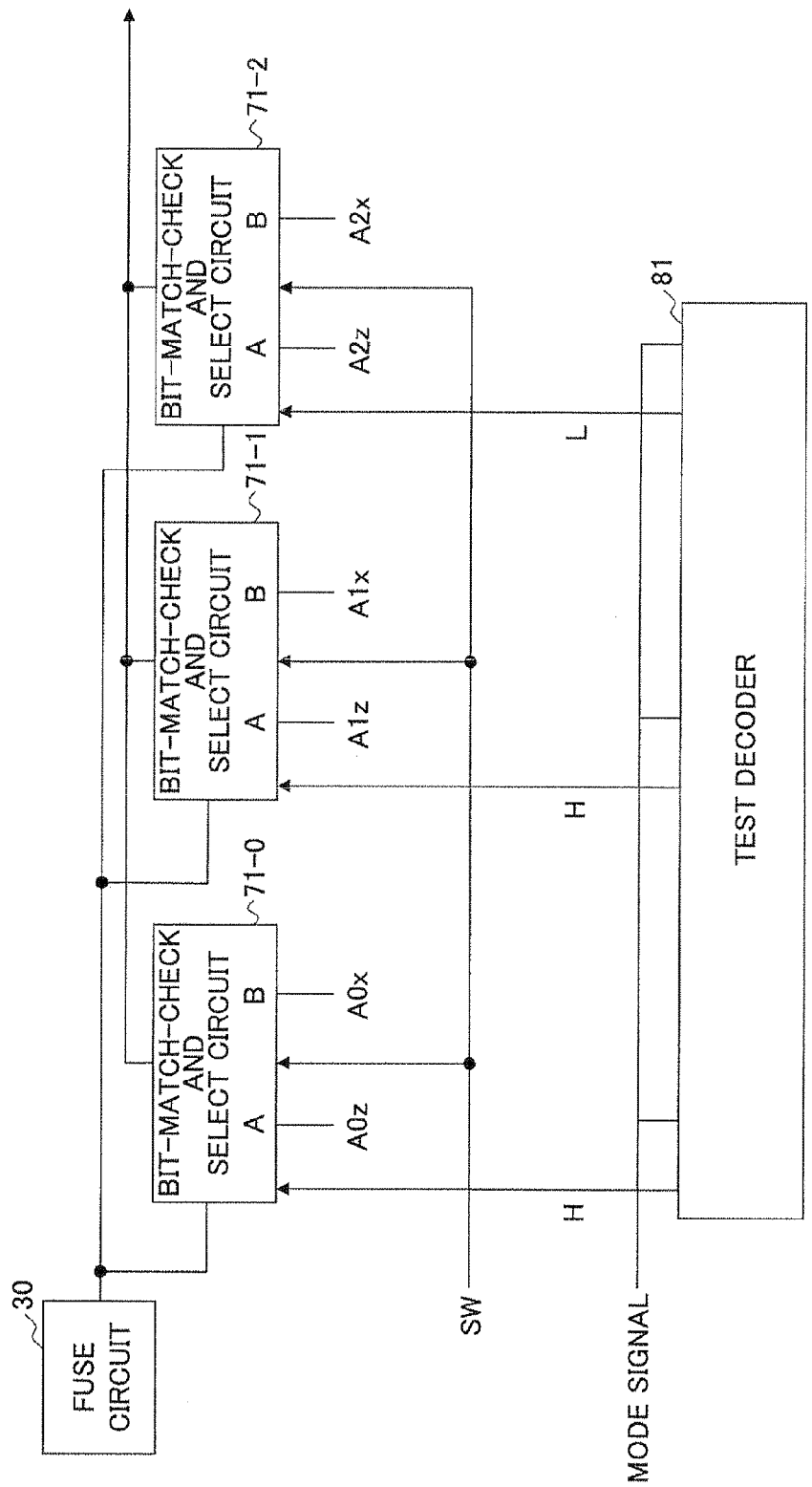
FIG. 10 is a drawing illustrating an example of the configuration of an address specifying and selecting circuit and a test decoder according to the third embodiment.

FIG. 10 is a drawing illustrating an example of the configuration of the address specifying and selecting circuit 61 and the test decoder 81. In FIG. 10, the same elements as those of FIG. 7 are referred to by the same numerals, and a description thereof will be omitted.

In FIG. 10, the bit-match-check and select circuits 71-0 through 71-2 correspond to the address specifying and selecting circuit 61. The example illustrated in FIG. 7 demonstrates a case in which the address to be checked for redundancy operations is comprised of three bits, for the sake of convenience of explanation.

The output of the fuse circuit 30 is comprised of three bits corresponding to a redundancy address. The least significant bit (i.e., first bit) is supplied to the bit-match-check and select circuit 71-0. The second bit is supplied to the bit-match-check and select circuit 71-1. The most significant bit (i.e., third bit) is supplied to the bit-match-check and select circuit 71-2. The test decoder 81, produces an address bit pattern responsive to the mode signals that are externally applied.

In the example illustrated in FIG. 10, the test decoder 81 produces the address bit pattern "LHH" (i.e., "100") as the three address bits from the most significant bit to the least significant bit. In this case, the signals input into the address specifying and selecting circuit 61 (i.e., the bit-match-check and select circuits 71-0 through 71-2) are the same as those of the second embodiment illustrated in FIG. 7. Only the most significant bit A2 is thus inverted by the bit-match-check and select circuit 71-2.

The produced address bit pattern is obtained by decoding the mode signals applied to the test decoder 81. The test decoder 81 may be configured such that the produced address bit pattern is "HHL" in the case of the mode signals being "00", "HLH" in the case of the mode signals being "10", and "LHH" in the case of the mode signals being "01", for example. Alternatively, a circuit to perform a predetermined addition operation responsive to mode signals may be provided in place of the test decoder 81. The mode signals and the specifications of the addition operation may be associated with each other such that the addition operation is +1 in the case of the mode signals being "00", +2 in the case of the mode signals being "10", and +4 in the case of the mode signals being "01", for example.

In this manner, the address specifying and selecting circuit 61 of the third embodiment produces a bit pattern indicative of bitwise matches or mismatches between the first address "000" and an externally applied address if the selecting circuit (i.e., NOR gate 78) selects the first address "000". This bit pattern is "111" if the applied address is "000". Further, the address specifying and selecting circuit 61 produces a bit pattern obtained by inverting or non-inverting the respective bits of the above-noted bit pattern indicative of bitwise matches or mismatches in response to the respective bit values of the address bit pattern "LHH" (i.e., the output of the set-address latch circuit 62) if the selecting circuit (i.e., NOR gate 78) selects the second address. The bit pattern indicative of bitwise matches or mismatches is "011" if the applied address is "100". The third bit of this bit pattern is inverted in response to the address bit pattern "LHH" to become "111". In this case, therefore, the redundancy address "100" is specified.

Figure 11:
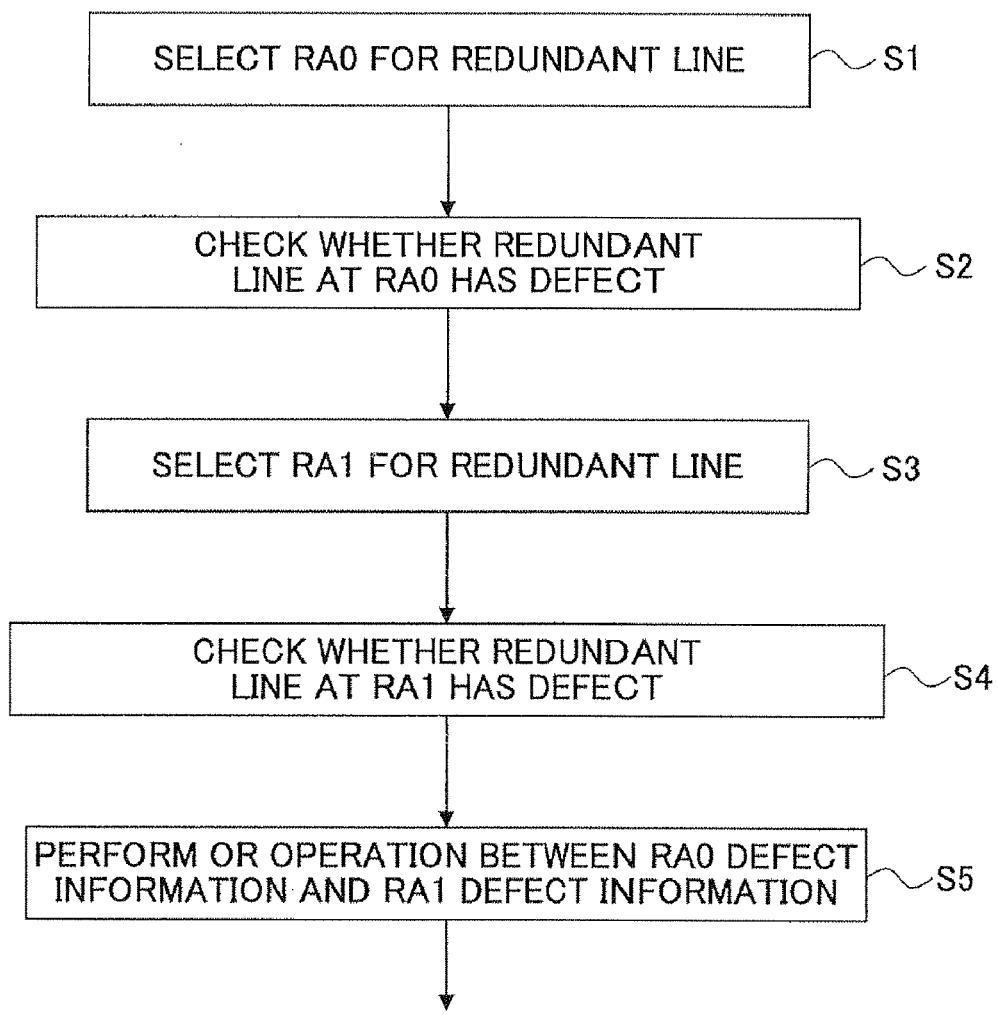
FIG. 11 is a flowchart illustrating the procedure of a test that checks an operation of the semiconductor memory device illustrated in FIG. 1.

FIG. 11 is a flowchart illustrating the procedure of a test that checks an operation of the semiconductor memory device 10 illustrated in FIG. 1. In the semiconductor memory device 10, plural redundancy addresses are assigned to a single redundant element (e.g., word line). Provision is thus made such that an apparatus that conducts an operation test recognizes the fact that these redundancy addresses correspond to the single redundant element.

In step S1, an address RA0 is assigned as a redundancy address to a redundant line. In step S2, a first operation test is conducted to access the redundancy address RA0 to check whether there is a defect with the redundant line. In step S3, an address RA1 is assigned as a redundancy address to the above-noted redundant line. In step S4, a second operation test different from the first operation test is conducted to access the redundancy address RA1 to check whether there is a defect with the redundant line.

In step S5, a logical OR operation is performed between the defect cell information obtained with respect to the redundancy address RA0 and the defect cell information obtained with respect to the redundancy address RA1. Namely, an arrangement is made to avoid the use of the redundant line due to its defective nature if either test indicates that the redundant line is defective. The redundant line is usable for a redundancy operation only if the first operation test detects no defect with respect to the redundancy address RA0, and concurrently if the second operation test detects no defect with respect to the redundancy address RA1.

Figure 12:
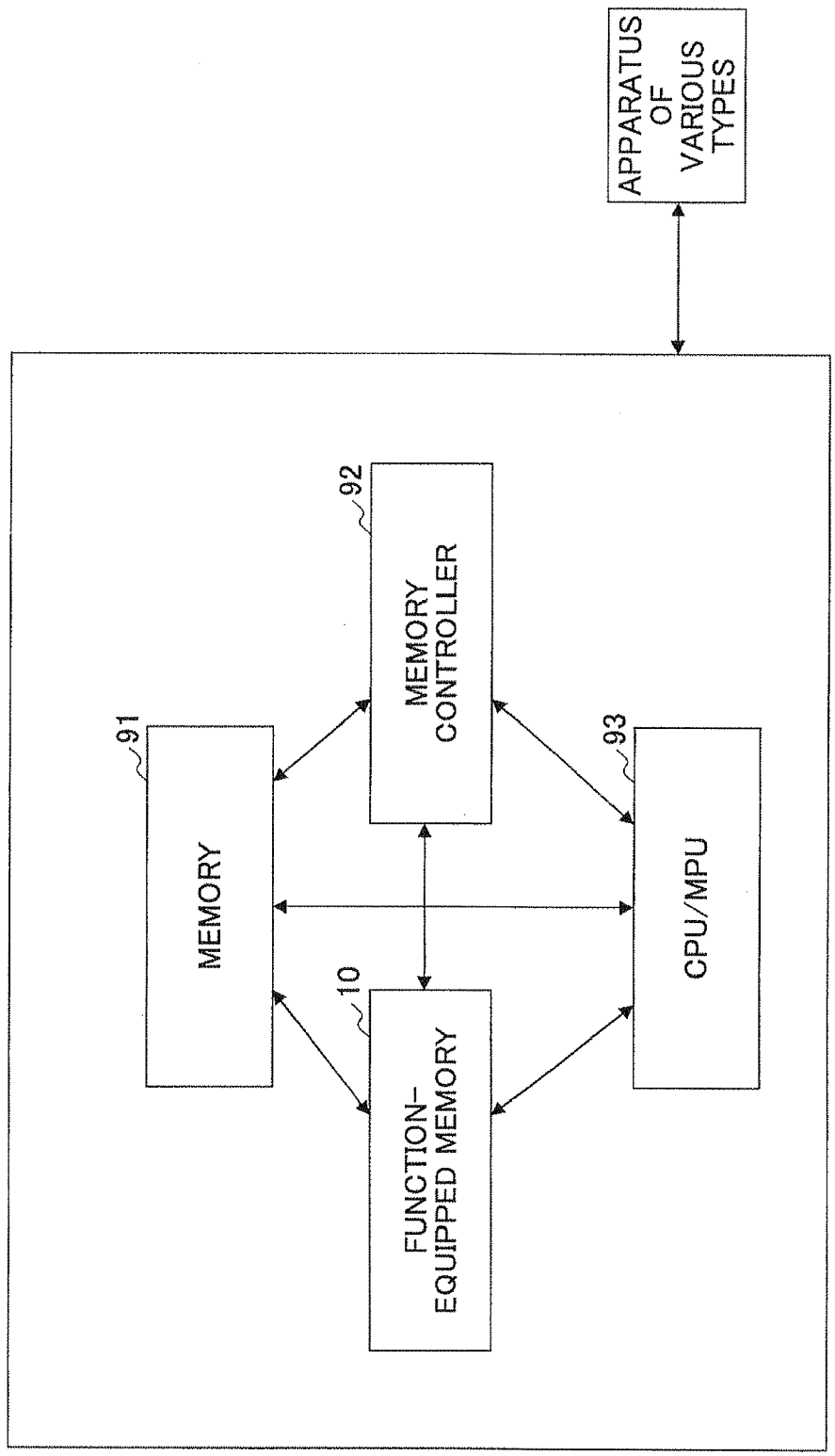
FIG. 12 is a drawing illustrating an example of the configuration of a system.

FIG. 12 is a drawing illustrating an example of the configuration of a system. A system illustrated in FIG. 12 includes the semiconductor memory device (function-equipped memory) 10 of FIG. 1, a memory 91, a memory controller 92, and a CPU or MPU 93. In a test to check the operation of the semiconductor memory device 10, a redundant element is selected when an address specified by the CPU 93 matches the redundancy address selected by the address specifying unit (e.g., the address specifying circuits 41 and 42 illustrated in FIG. 3). The switchover signal SW (see FIG. 3, for example) may be changed in response to instruction from the CPU 93 thereby to change the redundancy address assigned to this redundant element.

Figure 13:
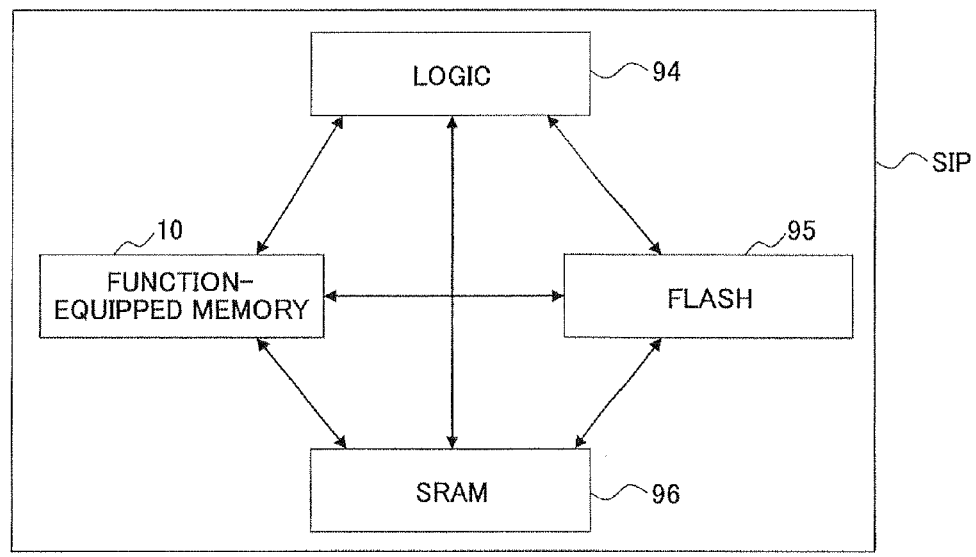
FIG. 13 is a drawing illustrating an example of the configuration of the system that is implemented as an SIP.

FIG. 13 is a drawing illustrating an example of the configuration of the system that is implemented as an SIP. The SIP (System In Package) illustrated in FIG. 13 includes the semiconductor memory device (function-equipped memory) 10, a logic circuit 94, a flash memory 95, and an SRAM 96.

Figure 14:
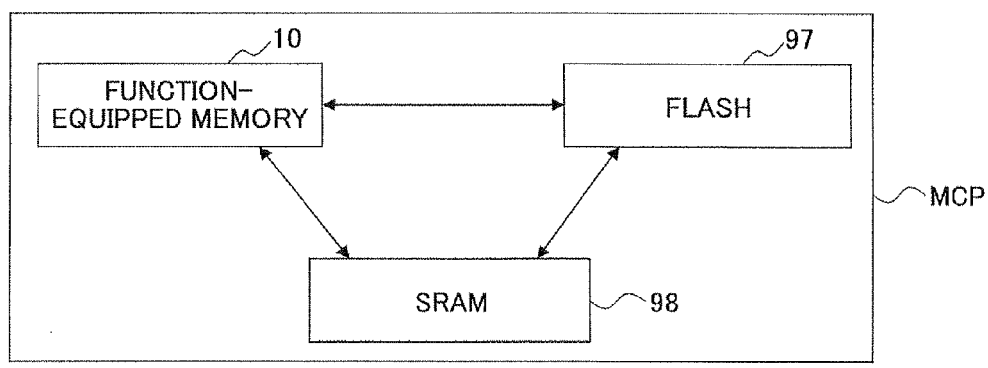
FIG. 14 is a drawing illustrating an example of the configuration of the system that is implemented as an MCP.

FIG. 14 is a drawing illustrating an example of the configuration of the system that is implemented as an MCP. The MCP (Multi Chip Package) illustrated in FIG. 14 includes the semiconductor memory device (function-equipped memory) 10, a flash memory 97, and an SRAM 98. The semiconductor memory device 10 according to the embodiments described heretofore may be utilized in various types of implementations as noted above.

According to at least one embodiment, provision is made such that one of a plurality of addresses is selected as a redundancy address in response to a switchover signal. With this provision, the test mode setting circuit may change the switchover signal in response to an externally applied input, thereby changing a redundancy address assigned to a redundant element (e.g., a predetermined redundant word line or the like). Namely, the redundancy address assigned to a redundant word line corresponding to the fuse circuit may be switched between different addresses as appropriate. This allows an optimum redundancy address to be assigned in response to the specifications of an operation test.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiment(s) of the present inventions have been described in detail, it should be understood that the various changes, substitutions, and alterations could be made hereto without departing from the spirit and scope of the invention.

What is claimed is:

1. A semiconductor memory device, comprising:
    a memory cell array;
    a redundant element;
    an address specifying circuit configured to select one of a plurality of addresses as a redundancy address in response to a switchover signal;
    a decoder circuit configured to select the redundant element in response to an externally applied address that matches the redundancy address selected by the address specifying circuit; and
    a test mode setting circuit configured to change the switchover signal in response to an externally applied input, thereby to cause the redundancy address assigned to the redundant element to be switched between different ones of the plurality of addresses.

2. The semiconductor memory device as claimed in claim 1, wherein the address specifying circuit includes:
    a first address specifying circuit configured to specify a first address;
    a second address specifying circuit configured to specify a second address; and
    a select circuit configured to select one of an output of the first address specifying circuit and an output of the second address specifying circuit in response to the switchover signal.

3. The semiconductor memory device as claimed in claim 2, wherein the first address specifying circuit produces as the output thereof a first bit pattern indicative of bitwise matches or mismatches between the first address and an externally applied address, and the second address specifying circuit produces as the output thereof a second bit pattern indicative of bitwise matches or mismatches between the second address and the externally applied address.

4. The semiconductor memory device as claimed in claim 3, further comprising a memory circuit configured to store a defective address in a nonvolatile manner, and wherein the first address specifying circuit is configured to selectively invert bits of the first bit pattern in response to respective bit values of an output of the memory circuit.

5. The semiconductor memory device as claimed in claim 1, wherein the address specifying circuit includes:
    an address specify circuit configured to specify a first address;
    a register configured to store an address bit pattern that is externally applied; and
    a select circuit configured to select one of the first address and a second address responsive to the address bit pattern stored in the register in response to the switchover signal.

6. The semiconductor memory device as claimed in claim 5, wherein the address specify circuit is configured to produce a bit pattern indicative of bitwise matches or mismatches between the first address and an externally applied address in response to selection of the first address by the select circuit, and to produce a bit pattern obtained by selectively inverting respective bits of the bit pattern indicative of bitwise matches or mismatches depending on respective bit values of the address bit pattern in response to selection of the second address by the select circuit.

7. The semiconductor memory device as claimed in claim 6, further comprising a memory circuit configured to store a defective address in a nonvolatile manner, and wherein the address specify circuit is configured to selectively invert bits of the bit pattern indicative of bitwise matches or mismatches in response to respective bit values of an output of the memory circuit.

8. The semiconductor memory device as claimed in claim 1, wherein the address specifying circuit includes:
    an address specify circuit configured to specify a first address;
    a pattern specify circuit configured to produce an address bit pattern responsive to an externally applied signal; and
    a select circuit configured to select, in response to the switchover signal, one of the first address and a second address that is obtained by modifying a value of the first address in response to the address bit pattern produced by the pattern specify circuit.

9. The semiconductor memory device as claimed in claim 8, wherein the address specify circuit is configured to produce a bit pattern indicative of bitwise matches or mismatches between the first address and an externally applied address in response to selection of the first address by the select circuit, and to produce a bit pattern obtained by selectively inverting respective bits of the bit pattern indicative of bitwise matches or mismatches depending on respective bit values of the address bit pattern in response to selection of the second address by the select circuit.

10. A system, comprising:
    a CPU; and
    a memory,
    wherein the memory includes:
    a memory cell array;
    a redundant element;
    an address specifying circuit configured to select one of a plurality of addresses as a redundancy address in response to a switchover signal;

a decoder circuit configured to select the redundant element in response to an address specified by the CPU that matches the redundancy address selected by the address specifying circuit; and a test mode setting circuit configured to change the switchover signal in response to instruction from the CPU, thereby to cause the redundancy address assigned to the redundant element to be switched between different ones of the plurality of addresses.

* * * * *